United States Patent [19]

Ackerman et al.

[11] Patent Number: 5,041,791
[45] Date of Patent: Aug. 20, 1991

[54] MAGNETIC RESONANCE RF PROBE WITH ELECTROMAGNETICALLY ISOLATED TRANSMITTER AND RECEIVER COILS

[75] Inventors: Joseph J. H. Ackerman; Wei Chen, both of St. Louis, Mo.

[73] Assignee: Washington University, St. Louis, Mo.

[21] Appl. No.: 562,550

[22] Filed: Aug. 6, 1990

Related U.S. Application Data

[63] Continuation-in-part of Ser. No. 390,176, Aug. 7, 1989, Pat. No. 4,996,481.

[51] Int. Cl.$^5$ ............................................. G01R 33/20
[52] U.S. Cl. .................................................... 324/318
[58] Field of Search ................................ 324/318, 322; 128/653 R, 653 SC

[56] References Cited

U.S. PATENT DOCUMENTS

| | | | |
|---|---|---|---|
| 4,707,664 | 11/1987 | Fehn et al. ............................ | 324/312 |
| 4,724,389 | 2/1988 | Hyde et al. ........................... | 324/318 |
| 4,752,738 | 6/1988 | Patrick et al. ........................ | 324/318 |
| 4,857,850 | 8/1989 | Mametsa et al. ..................... | 324/318 |
| 4,939,465 | 7/1990 | Biehl et al. ........................... | 324/318 |
| 4,943,775 | 7/1990 | Boskamp et al. ..................... | 324/322 |

Primary Examiner—Michael J. Tokar
Attorney, Agent, or Firm—Rogers, Howell & Haferkamp

[57] ABSTRACT

An RF probe for use in magnetic resonance application includes a transmitter coil for transmitting RF energy to excite a specimen and receiver coil for sensing the RF energy absorbed or emitted by the specimen wherein, in a first embodiment, the receiver coil has a primary coil loop for placement immediately adjacent a specimen and a secondary coil loop, said receiver coil loops being anti-phase and connected in series and wherein the secondary receiver coil loop may be angularly rotated with respect to the transmit coil in order to balance the current induced in both receiver coil elements to achieve a zero net induced current from the transmit coil while the primary receiver coil element is in position for taking measurements. In a second embodiment, the receiver coil element has a pair of parallel connected anti-phase coil elements, and the primary coil element for placement immediately adjacent the specimen has a reduced inductance and, hence, impedance such that it exhibits an increased sensitivity and greater signal-to-noise ratio.

19 Claims, 4 Drawing Sheets

MAGNETIC RESONANCE RF PROBE WITH ELECTROMAGNETICALLY ISOLATED TRANSMITTER AND RECEIVER COILS

CROSS REFERENCE TO RELATED APPLICATION

This application is a continuation-in-part of application Ser. No. 07/390,176 filed Aug. 7, 1989, and now U.S. Pat. No. 4,996,481.

BACKGROUND AND SUMMARY OF THE INVENTION

The technique for chemically analyzing living tissue through nuclear magnetic resonance (NMR) phenomena is well known and essentially includes locating a tissue sample and a transmitter/receiver probe within a strong magnetic field, and using the probe to excite the tissue with RF energy and measure the frequency and strength of the RF energy absorbed or emitted by the tissue. One type of probe used in such magnetic resonance analysis includes multiple antenna surface-coil probes generally comprised of a larger outer circular coil employed as a transmitter and a smaller inner circular coil employed as a receiver. These probes are useful in proton decoupled carbon-13 NMR, DEPTH pulse sequence spatial focusing, Fourier series spatial windowing and one-dimensional rotating frame Zeugmatography. For simplicity, reference will be made solely to the multiple antenna surface-coil NMR probes in one of these applications while it shall be understood that other applications are similarly suitable for similar types of probe designs.

With multiple antenna surface-coil NMR probes, the primary technical problem in the prior art has been the electromagnetic coupling between the two coils. The magnetic field produced by the RF energy driving the transmitter or larger coil has a tendency to induce an RF current in the smaller receiver coil that generates an opposing electromagnetic field which distorts the distribution of RF energy, the magnetic field pattern, of the larger transmitter coil. In a similar, although much less marked manner, the small receiver coil can be thought of as also inducing current in the large transmitter coil. This effect is especially severe when both coils are tuned to the same operating frequency and are co-axially oriented. While this coupling between coils may be measured and adjusted for, it is undesirable in that it generally dramatically degrades the frequency and impedance tuning of the transmitter/receiver electrical circuit, perturbs the desired characteristic of each antenna, complicates the analysis required to interpret the results, and also is an unwanted variable which reduces the accuracy of the data collected.

In the prior art, a number of methods have been developed and utilized for reducing the coupling between coils in a multiple antenna surface-coil probe. These methods typically employ quarter wavelength co-axial transmission lines and/or crossed diodes. Although advances in such coil-to-coil decoupling techniques have yielded improved isolation and workable co-axial surface-coil probe designs, operational problems remain. Non-idealities of transmission lines and diodes lower the antenna circuit quality factor (Q) of the coils. Furthermore, proper adjustment of quarter wavelength cable length and placement in the circuit are non-trivial due to the cable size and required cable change for change in operating frequency. With crossed diodes, separate tuning and matching of each coil requires (ideally) sufficient RF current to short circuit the diodes.

Still another approach in the prior art has been to use two single separate coils fixed in orientation and placed in close proximity so as to form a strongly coupled (high mutual inductance) transformer pair. By choosing the radio frequency circuit resonance mode that corresponds to counter current flow in the two loops, the coupling between a homogeneous transmitter field and the counter current receiver is nulled. Two substantial drawbacks to this approach has made it of limited utility. First, the fixed, nonadjustable (anti-phase) coupling of the receiver elements to the transmitter field presents a true near induced current null only in the absence of asymmetries in the transmitter field over the receiver elements. In practice, such asymmetries are present in most real transmitter fields and, perhaps more importantly, are induced by electromagnetically susceptible specimens. Indeed, distinction of this idealized anti-phase transmitter/receiver decoupling through imbalancing of the transmitter field by the specimen is the working principle behind metal detector gradiometers. However, for the NMR experiment, the signal to be detected arises solely from the specimen after excitation by the transmitter and, thus, the transmitter/receiver coupling must remain nulled in the presence of the specimen. Thus, one must fall back on additional decoupling methods such as the use of cross diodes discussed above. Second, the use of strongly coupled anti-phase loops results in greatly reduced signal detection sensitivity (approximately four-fold) unless the specimen itself presents the dominant noise source in the form of induced eddy currents. In instances where specimen eddy current losses are not the dominant noise source, signal-to-noise is greatly reduced by the strongly coupled nature of the two loops.

As disclosed and claimed in the parent patent, the inventors have previously developed a co-axial multiple antenna surface-coil NMR probe which utilizes typically a larger circular loop for the transmitter coil and a smaller receiver coil consisting of not one but two series connected circular loop elements wound in the opposite direction, the elements being oriented generally symmetrically about the transmitter loop, and in loosely coupled (low mutual inductance) fashion. The probe designs disclosed therein provided for nulling the induced receiver coil current in the presence of the specimen by adjustment of the relative position between the receiver coil elements and the transmitter coil while maintaining their coaxial alignment. Therefore, with the transmitter coil located approximately midway between the two opposed loops comprising the receiver coil, the transmitter magnetic field can be thought of as inducing currents in the two loops of the receiver coil of the same strength but in opposite directions in the single conductor. This results in a net induced current in the receiver coil of substantially zero such that there is no magnetic field produced corresponding to an induced current to disturb the field distribution pattern of the transmitter coil. Furthermore, the second loop added to the typical single loop receiver coil does not enter into the detection operation of the receiver coil in that the second receiver coil loop is sufficiently far away from the sample that it can be ignored. In other words, the second receiver coil loop is beyond the sensitive volume of the sample region of the first receiver coil loop. Thus, the receiver antenna becomes essentially equivalent to the single loop receiver antenna of the prior art that is typically positioned adjacent to the sample. The inventors have constructed a probe which achieves isolation of greater than 40 db between the transmit and receive antennas, and believe that isolation of upwards of 50 db may be readily attained.

While there are many advantages and features of the probe disclosed in the parent patent over the prior art, some of these include the fact that the inventors' device relies simply on the geometry of the receiver coil to achieve decoupling. With such an arrangement, standard, proven surfacecoil designs may be readily utilized without alteration and without the difficulties experienced in the prior art of utilizing particular frequency dependent transmission line filters or diode elements. By utilizing standard proven surface-coil designs, well defined fields are guaranteed to be produced so as to optimize the results attainable from NMR techniques utilizing the present probe. Well defined fields are generally considered as being fields over the region of interest which are homogeneous, exhibit a linear gradient, or which produce typical and well documented field patterns for well known surface-coil type designs, e.g., circular or rectangular coils. Also, the inventors+ design is frequency independent which provides maximum versatility for a probe.

Other embodiments are also disclosed, including embodiments demonstrating asymmetrical receiver coil arrangements, dual element transmitter coils, and other non-orthogonal arrangements which also decouple the transmitter coil from the receiver coil in the NMR probe.

As a further enhancement to the probe designs disclosed in the parent patent, the inventors have found that it is possible to achieve an adjustable decoupling of the receiver coil from the transmitter coil via a change in the angular orientation of at least one of the two coil elements which comprise the receiver coil. In the preferred embodiment, the receiver coil is comprised of a pair of series connected loops. One of these loops is designated the primary loop and is used to sense the NMR effects in the specimen. Hence, it is arranged for placement close to the specimen as the probe is used. The inventors have found that the specimen may in and of itself have electromagnetic properties such that merely bringing the primary receiver coil element into close proximity with it may cause a perturbation in the transmitter field such that it distorts the field and induces a current in the receiver coil. As disclosed in the parent patent, this may be adjusted for by shifting the relative position between the transmitter coil and the receiver coils as they remain generally coaxially aligned. That same balancing may be achieved by angularly rotating the secondary receiver coil element with respect to both the transmit coil and the primary receiver coil element (which remain fixed with respect to each other) to thereby adjust the coupling between the transmit coil and receiver coil in the presence of the specimen. This angular adjustment could be conveniently implemented about either the Z axis or Y axis, presuming that the transmit coil and primary receiver coil elements are coaxially aligned along the X axis. With this arrangement, the induced current in the secondary receiver coil element depends upon the angle between the secondary receiver coil element and the transmitter coil. The induced current is maximal when that angle is 0°, and minimal when that angle is 90°, while the induced current in the primary receiver coil element is constant. Of course, complete decoupling between the transmitter coil and receiver coil is achieved when the induced current in the receiver coil elements (primary and secondary) are equal and of opposite phase. In order to accommodate a range of adjustment, the maximal induced current in the secondary receiver coil element should be equal to or (preferably) greater than that of the primary receiver coil element.

Although this preferred embodiment is addressed to the particular arrangement shown which, for convenience, depicts the primary receiver coil element and transmit coil in a coaxial alignment, it should be understood to one of ordinary skill in the art that other arrangements would perform equally well. These would include a receiver coil wherein both receiver coil elements are separately rotatable in order to adjust their coupling with the transmit coil. Furthermore, in still another alternative, the field of the secondary receiver coil element could be altered to null out the induced receiver coil current by positioning an electromagnetically susceptible vane or the like therein. This alternative provides the advantage of fixed primary and secondary receiver coil elements which improves the mechanical stability thereof. Still even more generally, the concept of the present invention includes any device or arrangement for altering the electromagnetic response of a receiver coil element in a controlled manner to null out the total receiver coil current induced by the transmitter coil while the sensing element of the receiver coil is located substantially adjacent the specimen for taking measurements therefrom.

In order to reduce overall receiver coil resistance, and also to improve the quality factor and signal-to-noise ratio in the receiver coil, the inventors have developed a parallel connected receiver coil wherein the two receiver coil elements are connected in parallel instead of in series as in the other probe embodiments disclosed herein. Thus, the total anti-phase receiver coil resistance is reduced significantly being less than the resistance of the primary receiver loop alone, which is equivalent to a single-loop coil. This reduction in resistance improves the signal sensitivity of the anti-phase receiver coil. With this arrangement, it is possible to have a primary coil element with a lower inductance than that of the secondary coil and wherein the coil elements are oppositely wound and physically located such that the current induced by the transmitter in the primary element is equal but opposite in phase to the current induced in the secondary element. Therefore, the dual element parallel connected receiver coil may still exhibit the desired isolation from the transmitter coil by having a zero net induced current. However, it is well understood in the art that by way of theoretical analysis the receiver element signal sensitivity is directly proportional to the fraction of current passing through that element when a hypothetical unit current is applied to the entire receiver coil structure. Therefore, as the primary coil has a lower inductance than that of the secondary coil and hence a lower impedance, a greater proportion of the receiver coil current will pass through the primary coil element. This results in improved sensitivity of the primary coil element. As the electromagnetic coupling of the transmitter field to each of the two coil elements of the receiver coil is imbalanced, one of the techniques disclosed herein for balancing the anti-phase currents (i.e., radio frequency currents whose phases are essentially 180 different) induced in the receiver coil elements may be utilized to ensure that a zero net induced current is experienced with the specimen in place.

In practice, the parallel connected, imbalanced inductance receiver coil may be constructed by winding the primary receiver coil element out of thick copper wire which exhibits low RF impedance and winding a substantially larger (or greater number of turns) secondary receiver coil element from thinner copper wire. The imbalance in transmitter field coupling to the receiver coil elements may then be nulled by physically spacing the receiver coil element closer to the transmitter coil. With this arrangement, the secondary coil element will have much greater inductance and impedance than the primary coil element so that more of the hypothetical unit current will be shunted through the primary coil element, maximizing its sensitivity and signal-to-noise ratio.

Although the probes discussed herein explicitly include a transmitter element that excites the sample prior to signal detection by the receiver element, it is understood that the general principles described herein for adjustable asymmetric anti-phase current decoupling of the receiver from the transmitter in the presence of the specimen are applicable to the case of a transmitter structure not formally part of the probe assembly, e.g. a large "homogeneous field" transmitter that surrounds the anti-phase receiver elements.

While the principal advantages and features of the present invention have been described above, a greater understanding and appreciation for the objects of the present invention may be attained by referring to the drawings and description of the preferred embodiment which follow.

DETAILED DESCRIPTION OF THE PREFERRED EMBODIMENT

Figure 1:
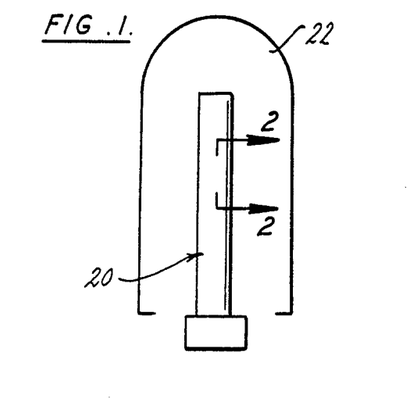
FIG. 1 is a schematic representation of the probe oriented in a super conducting magnet.
Figures 2, 3, 4, 5:
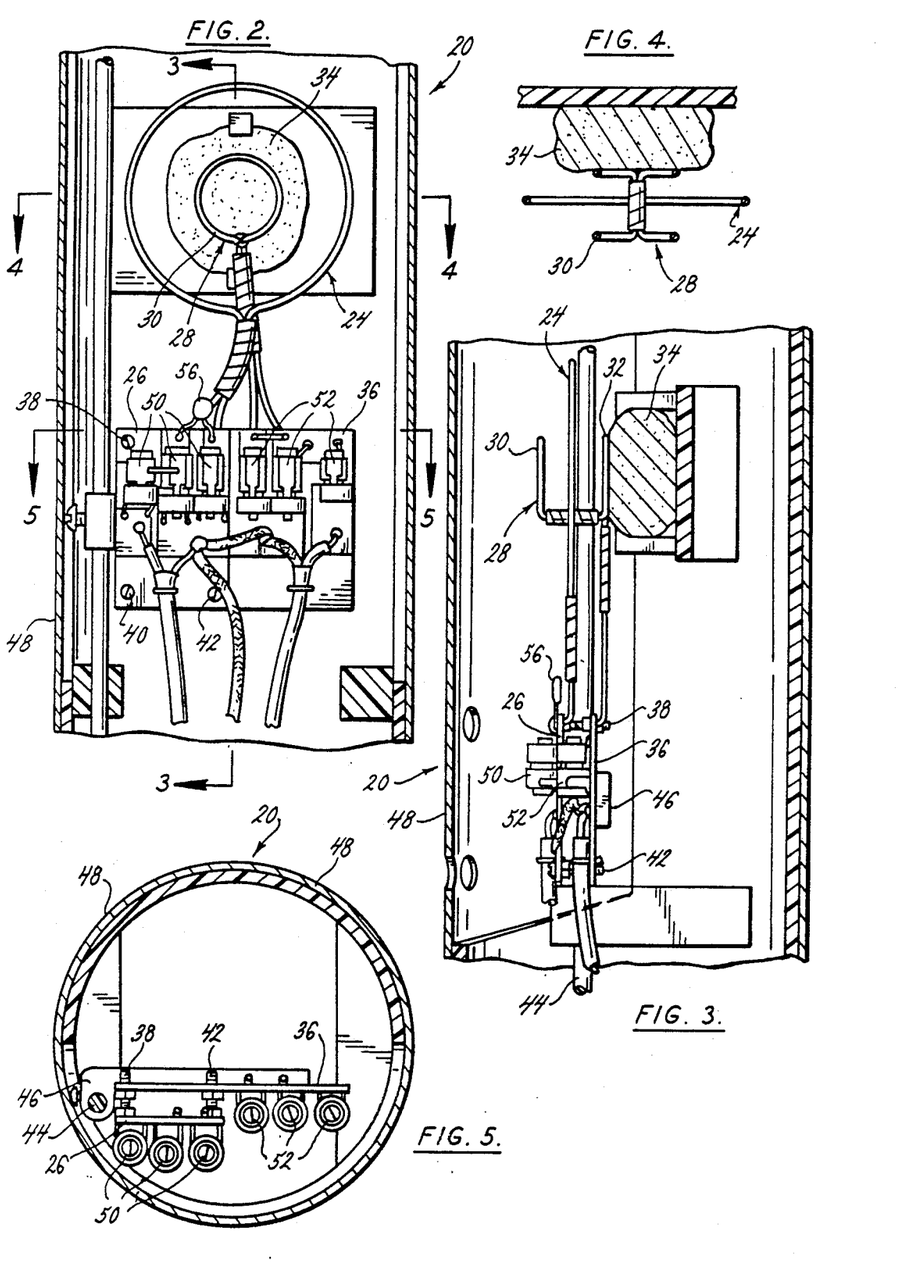
FIG. 2 is a partial cross-sectional view taken along the plane of line 2—2 in FIG. 1 and detailing a front view of the transmitter and receiver coils as formed in a first embodiment.
FIG. 3 is a partial cross-sectional view taken along the plane of line 3—3 in FIG. 2 and showing a side view of the transmitter and receiver coils in contact with a tissue sample inside the probe.
FIG. 4 is a partial cross-sectional view taken along the plane of line 4—4 in FIG. 2 and further detailing the receiver coil in direct contact with the tissue being examined.
FIG. 5 is a partial cross-sectional view taken along the plane of line 5—5 in FIG. 2 and detailing the mounting platform arrangement between the transmitter coil and receiver coil.

As shown in FIG. 1, a probe 20 is commonly used in magnetic resonance research and analysis by placing it within a super conducting magnet 22 or the like which produces a high static homogeneous magnetic field. The probe 20 is shown in greater detail in FIGS. 2-5 and includes a transmitter coil 24 which is formed from a single conductor into a generally circular configuration and mounted to a PC board 26. A receiver coil 28 is similarly formed from a single conductor and is comprised of a pair 30, 32 of generally circular elements or inductive, near field radiators which are disposed on opposite sides of the transmitter coil 24, with one of the elements 32 being placed adjacent the tissue sample 34 for analysis purposes, as is well known in the art. The receiver coil 28 is itself mounted to a PC board 36, with transmitter PC board 26 being adjustably mounted by three screw assemblies 38, 40, 42 to receiver coil PC board 36. Receiver coil PC board 36 is cantilever mounted from a support rod 44 by a stud and collar assembly 46, thereby positioning the entire RF probe assembly within a cylindrical tube or shell 48. Each of PC boards 26, 36 have three adjustable capacitors 50, 52 for adjusting the RF response of its associated coil 24, 28.

Figure 6:
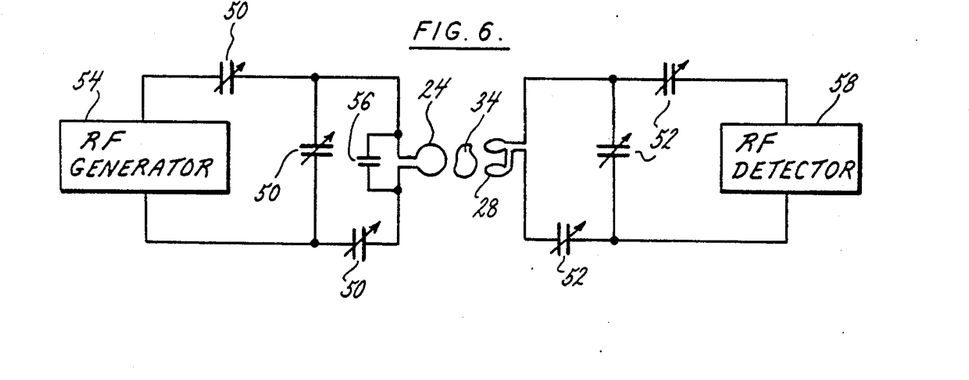
FIG. 6 is a schematic representation of the electrical circuit generally describing the operation of a typical probe.

A typical connection diagram for the probe 20 is shown in FIG. 6 and includes an RF generator 54 for supplying RF energy to the transmitter coil 24 with the three adjustable capacitors 50 along with a fixed capacitor 56 for adjusting the RF performance of the transmitter coil 24. A tissue sample 34 is thus bombarded with RF energy from the transmitter coil 24 and the receiver coil 28 detects the RF energy absorbed or emitted by the tissue 34 in response to the energy pulsed into the tissue sample 34 by transmitter coil 24. Similarly, tuning capacitors 52 peak the performance of receiver coil 28 such that the RF detector 58 senses the desired RF energy response. The protocol of NMR experimentation and analysis is well known in the art and is generally comprised of a number of different techniques, the details of which are unimportant for purposes of understanding the present invention, except to realize that the present invention is useful in many of these well known techniques and may be used with samples other than tissues, e.g., inert solids and liquids.

Figure 7:
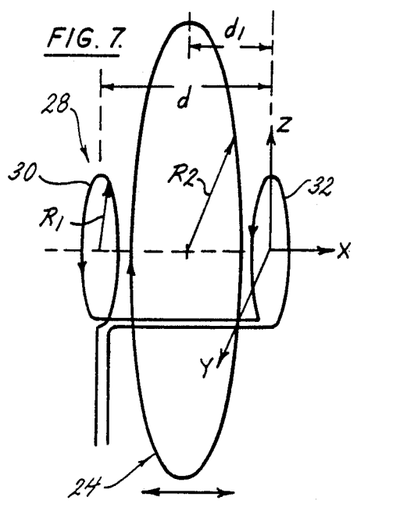
FIG. 7 is a schematic representation of the electrical circuit comprising the transmitter and receiver coils of the first embodiment.

An electrical schematic is shown in FIG. 7 which corresponds to the physical embodiment explained in detail in FIGS. 2-5 and includes a centrally located, generally circularly formed transmitter coil 24 comprised of a single loop of conductor. The receiver coil 28 is generally comprised of a first, generally circular, loop 30 of conductor wound in a first direction as well as a second, generally circular, loop 32 of single conductor wound in an opposite direction and spaced symmetrically about the transmitter coil 24 and generally co-axial therewith. In order to achieve the purposes of the present embodiment, it is only necessary that the current induced in loop 30 is equal but opposite to the current otherwise induced in loop 32 such that there is no net current induced in receiver coil 28 by the energy transmitted from transmitter coil 24. Thus, receiver coil 28 is decoupled or electrically isolated from transmitter coil 24 such that the RF energy sensed by receiver coil 28 is a result only of that which is emitted from the tissue sample 34. Furthermore, the field generated by transmitter coil 24 is not affected by the presence of receiver coil 28 such that a predictable and desired pulse of energy having a well defined distribution pattern is obtained. In order to ensure that there is no net current induced in receiver coil 28, one of ordinary skill in the art could easily develop variations of the particular embodiment shown in FIG. 7. All of these variations are included within the scope and teaching of the present concept, it only being necessary that the receiver coil 28 and transmitter coil 24 are oriented in a non-orthogonal manner, that the transmitter coil 24 produces a well defined magnetic field, and that there is no net current induced in receiver coil 28.

Figure 8:
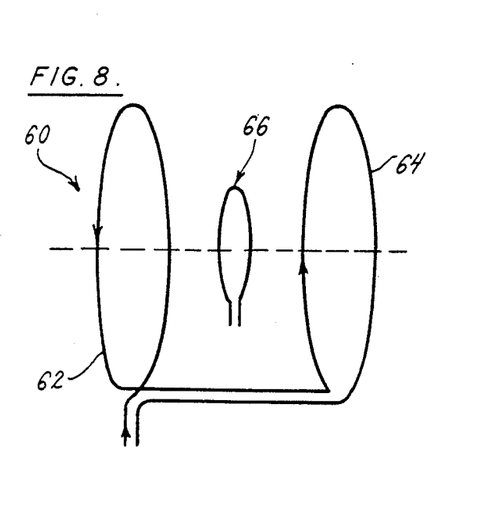
FIG. 8 is a schematic representation of the electrical schematic comprising a second embodiment wherein the transmitter coil is comprised of a pair of elements.

Of the many variations which are possible to the present concept, several have been considered as being particularly important and will hence be more specifically disclosed. For example, one such arrangement is shown in FIG. 8 and includes a transmitter coil 60 comprised of a first loop 62 and a second loop 64 which are wound in opposite directions, with a receiver coil 66 oriented co-axially and at the point of symmetry between loops 62, 64. In the art of magnetic resonance, a transmitter coil arrangement as shown in FIG. 8 may be used to produce a magnetic field having a linear gradient (and thus well defined) and, as the receiver coil 66 is symmetrically placed about both elements of the transmitter coil, a net current equal to zero is induced in the receiver coil 66.

Figure 9:
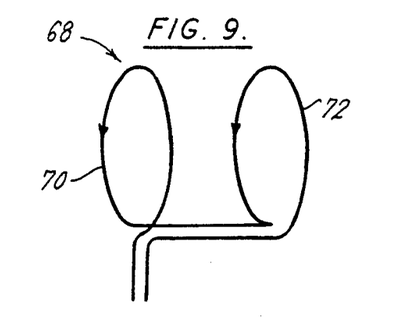
FIG. 9 is a schematic representation of the electrical schematic of a third embodiment comprising a receiver coil with a pair of elements located within a homogeneous magnetic field.

Still another variation is shown in the third embodiment of FIG. 9. In that embodiment, a homogeneous magnetic field may be produced by any transmitter coil arrangement and, hence, is not shown in FIG. 9. However, the mere presence of a receiver coil 68 comprised of a first loop 70 wound in one direction and a second loop 72 wound in a second direction results in an induced current equal to zero. Thus, a receiver coil as shown in FIG. 9 may be used not only in connection with the transmitter coil as shown in the first embodiment, but may also be used with a transmitter coil producing a homogeneous magnetic field and located at any point within the probe.

Figure 10:
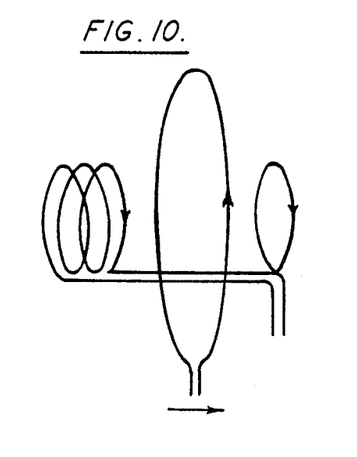
FIG. 10 is a schematic representation of the electrical schematic of a fourth embodiment comprising a receiver coil with a pair of elements, one of said elements having more windings than the other.

As shown in FIG. 10, an asymmetric receiver coil arrangement can be used and still achieve the desired decoupling effect. One element of the receiver coil can consist of more turns than the other element. This permits an asymmetrical placement of the transmitter coil between the two receiver coils. This may be desirable in some applications as it permits selection of the physical location for the transmitter coil with respect to the detector coil element. Thus, the desired portion of the transmitter coil field may be used to excite the specimen. In the embodiment shown, one receiver coil element is comprised of a single loop, while the other has multiple loops. Different combinations of numbers of loops may be used in order to select a wide range of positions for the transmitter coil.

Figure 11:
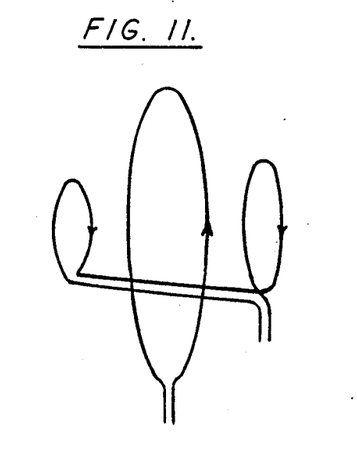
FIG. 11 is a schematic representation of the electrical schematic of a fifth embodiment comprising a receiver coil with a pair of elements, one of said elements being larger than the other.

As shown in FIG. 11, another technique to achieve an asymmetric placement of the transmitter coil utilizes receiver coil loops of different diameters. By varying the relative diameters of the receiver coil elements, the location of the transmitter coil can be selected to be at a wide range of positions therebetween.

The probe may be tuned by physically adjusting the relative location, size, and number of loops of the coil elements so as to cancel out the induced current via electrical symmetry while still producing a well defined field. Therefore, the present concept encompasses coils having many shapes depending upon the other requirements of the probe and particular application involved.

Figure 12A:
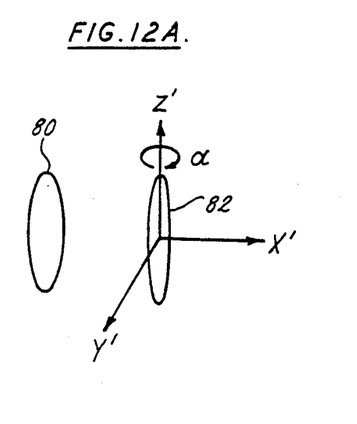
FIG. 12a is a schematic representation of the electrical schematic of another embodiment wherein the secondary receiver coil element is angularly rotated with respect to the transmit coil about the Z axis.
Figure 12B:
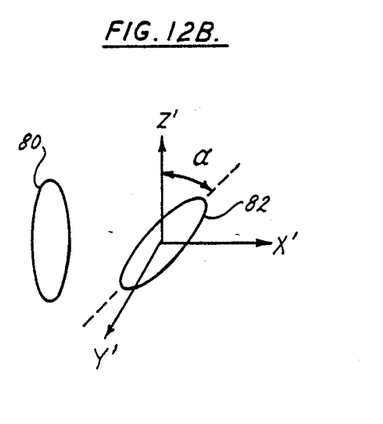
FIG. 12b is a schematic representation of the electrical schematic of another embodiment wherein the secondary receiver coil element is angularly rotated with respect to the transmit coil about the Y axis.

As shown in FIGS. 12a and b, a transmitter coil 80 is arranged generally coaxially with the primary coil element (not shown) of the receiver coil as well as the secondary coil element 82 in its initial placement. For tuning and in order to balance the current induced by the transmitter coil 80 in the receiver coil as the primary coil element is substantially adjacent the specimen, the secondary receiver coil 82 may be angularly rotated about either the Z axis as shown in FIG. 12a, or about the Y axis as shown in FIG. 12b, or about both of said axes. As is well known in the art, such rotation of the secondary receiver coil element 82 will decrease the coupling between the transmitter coil 80 and the secondary receiver coil 82 so as to reduce the amount of induced current therein. In order to accommodate varying conditions of specimen characteristics, the secondary receiver coil 82, when maximally coupled to the transmitter coil 80, should have an induced current equal to or greater than that which is induced in the primary receiver coil element if the effect of the specimen thereon is ignored.

Figures 13, 14:
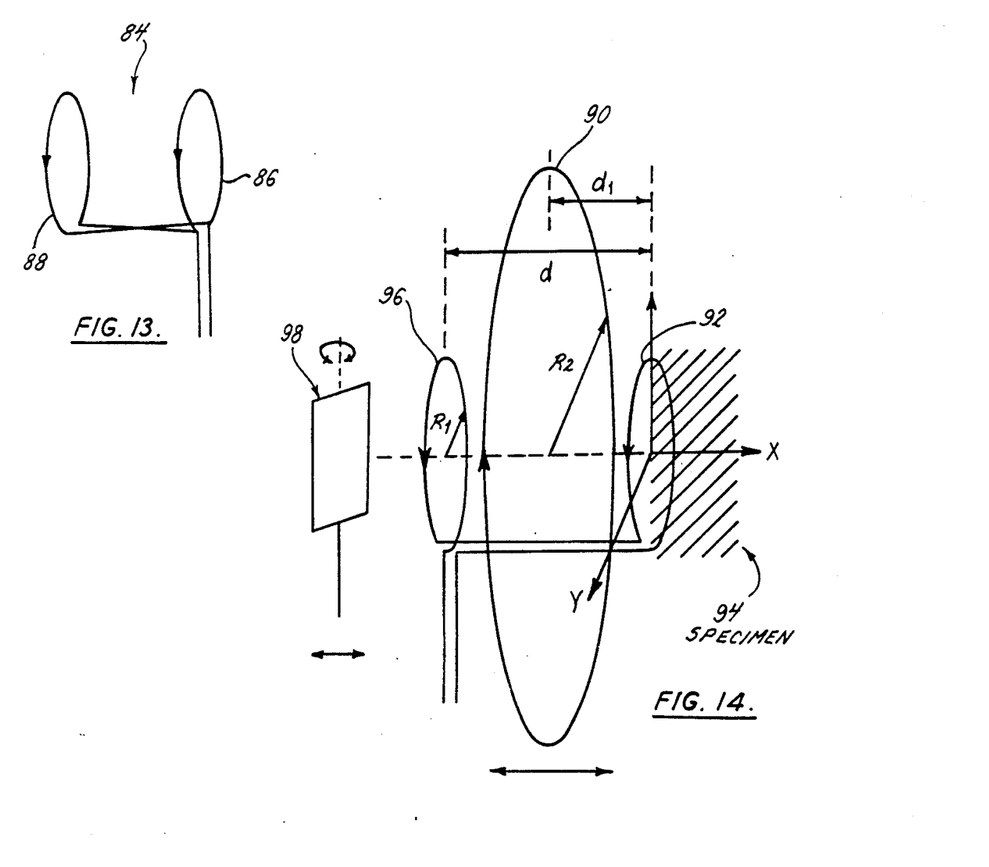
FIG. 13 is a schematic representation of the electrical schematic of another embodiment of the present invention wherein the receiver coil is comprised of a pair of parallel connected coil elements.
FIG. 14 is a schematic representation of the electrical schematic of still another embodiment wherein a material having magnetic susceptibility is used to alter the field of the secondary receiver coil element.

As shown in FIG. 13, a receiver coil 84 is comprised of a primary coil element 86 in parallel with a secondary coil element 88, with primary coil element 86 having a smaller inductance than the secondary coil element 88 such that a greater proportion of the hypothetical unit current (used for design analysis) flows therethrough as compared with that which flows in the secondary coil element 88. This improves the signal-to-noise ratio, and sensitivity of the receiver coil 84. In order to achieve a zero net induced current by the transmit coil, any of the other techniques disclosed herein can be used, e.g. adjusting the position of the secondary coil element 88 relative to the transmit coil, etc.

A last embodiment is shown in FIG. 14 and includes a transmit coil 90 surrounded by a receiver coil having two elements, a primary coil element 92 for sensing the specimen 94 and a secondary coil element 96. In this embodiment, a vane-like structure 98 generally comprised of a material having a significant magnetic susceptibility may be adjustably positioned within the magnetic field of secondary coil element 96 to thereby alter the amount of current induced therein by transmit coil 90. This vane 98 may thus be used to adjust the amount of current induced by transmit coil 90 and thereby balance with the effects imposed on primary coil element 92 by specimen 94. As may be noted, in this embodiment there is no change in the physical orientation between transmit coil 90 and receiver coil elements 92, 96 in order to achieve a balanced, zero net induced current from the transmitter coil 90. This embodiment thus provides enhanced mechanical stability over the probes of the other embodiments disclosed herein in that the other probes generally require movement or adjustability of one or more of the receiver coil elements.

There are various changes and modifications which may be made to the invention as would be apparent to those skilled in the art. However, these changes or modifications are included in the teaching of the disclosure, and it is intended that the invention be limited only by the scope of the claims appended hereto.

What is claimed is:

1. A multiple antenna surface-coil NMR probe for sensing the NMR response of a specimen following application of a transmitter field comprising a receiver coil including a primary coil element and a secondary coil element, said primary coil element being adapted for orientation substantially adjacent to a specimen for measurement thereof, said coil elements being substantially anti-phase, and means for adjusting the relative physical orientation of said secondary coil element with respect to said transmitter field to minimize the current induced in said receiver coil by said transmitter field as said primary coil element is positioned for measuring said specimen.

2. The device of claim 1 wherein the secondary coil element adjusting means comprises means to adjust the angular orientation of said secondary coil element.

3. The device of claim 2 further comprising a transmitter coil, and wherein the transmitter coil and the primary coil element remain in substantially the same orientation as said secondary coil element is adjusted.

4. The device of claim 3 wherein the transmitter coil and the primary coil element are aligned to be substantially coaxial, and the secondary coil element adjusting means has means for adjusting said secondary coil element about at least one other axis.

5. The device of claim 2 wherein said receiver coil elements are series connected.

6. The device of claim 2 wherein said receiver coil elements are parallel connected and have substantially different inductances.

7. The device of claim 1 further comprising means for changing the electromagnetic response of the receiver coil.

8. The device of claim 7 wherein said response changing means comprises a structure made at least partially of an electromagnetically susceptible material.

9. The device of claim 8 wherein said response changing means further comprises means for adjusting the relative position of the structure with respect to said secondary coil element.

10. A multiple antenna surface-coil NMR probe for sensing the NMR response of a specimen following application of a transmitter field comprising a receiver coil including a primary coil element and a secondary coil element, said receiver coil elements being substantially anti-phase and connected in parallel and said primary coil element being adapted for orientation substantially adjacent a specimen for measurement thereof and having a different inductance than said secondary coil element, said receiver coil being oriented with respect to said transmitter field so that substantially no significant current is induced in said receiver coil by said transmitter field.

11. The device of claim 10 wherein the primary coil element has less inductance than the secondary coil element.

12. The device of claim 11 further comprising means for adjusting the relative orientation of said receiver coil with respect to said transmitter field as said receiver coil is positioned adjacent the specimen so that said receiver coil induced current may be tuned to a minimum.

13. The device of claim 12 wherein the orientation adjusting means comprises means for adjusting the relative orientation of the secondary coil element.

14. The device of claim 13 further comprising a transmitter coil for generating said transmitter field.

15. A multiple antenna surface coil NMR probe for sensing the NMR response of a specimen following application of a transmitter field comprising a receiver coil including a primary coil element for placement immediately adjacent to the specimen and a secondary coil element, said coil elements being substantially anti-phase, and means for changing the electromagnetic response of at least one receiver coil element to the transmitter field to thereby minimize the current induced in said receiver coil by said transmitter field as said primary coil element is positioned for measuring said specimen response.

16. The device of claim 15 wherein the response changing means includes means for changing the response of said secondary coil element.

17. The device of claim 16 further comprising a transmitter coil, said receiver coil elements being oriented substantially electrically symmetrical to said transmitter field, except as adjusted by said response changing means.

18. The device of claim 15 wherein said response changing means comprises a structure made at least partially of an electromagnetically susceptible material.

19. The device of claim 18 wherein said response changing means further comprises means for adjusting the relative position of the structure with respect to said secondary coil element.

* * * * *

UNITED STATES PATENT AND TRADEMARK OFFICE
CERTIFICATE OF CORRECTION

PATENT NO. : 5,041,791
DATED : August 20, 1991
INVENTOR(S) : Ackerman et al

It is certified that error appears in the above—identified patent and that said Letters Patent is hereby corrected as shown below:

Column 2
Line 2
Delete the word "circuit"

Column 3
Line 4
Substitue -dB- for "db"

Column 3
Line 12
Substitute -surface coil- for "surfacecoil"

Column 3
Line 24
Delete the "+" (at the end of the line)

Signed and Sealed this

Twenty-third Day of February, 1993

Attest:

STEPHEN G. KUNIN

Attesting Officer     Acting Commissioner of Patents and Trademarks